(12) United States Patent
Kohama

(10) Patent No.: US 9,438,226 B2
(45) Date of Patent: Sep. 6, 2016

(54) SEMICONDUCTOR DEVICE INCLUDING FUNCTIONAL CIRCUITS

(71) Applicant: FUJI ELECTRIC CO., LTD., Kawasaki-shi (JP)

(72) Inventor: Takanori Kohama, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/687,232

(22) Filed: Apr. 15, 2015

(65) Prior Publication Data

US 2015/0365070 A1  Dec. 17, 2015

(30) Foreign Application Priority Data

Jun. 11, 2014 (JP) ................. 2014-120222

(51) Int. Cl.
 *G06F 1/26* (2006.01)
 *H03K 17/16* (2006.01)
 *H03K 17/22* (2006.01)

(52) U.S. Cl.
 CPC ..................... *H03K 17/22* (2013.01)

(58) Field of Classification Search
 CPC ........ G06F 1/26; H03K 17/00; H03K 17/16; H03K 17/161; H03K 17/162
 See application file for complete search history.

(56) References Cited

U.S. PATENT DOCUMENTS

| | | | | |
|---|---|---|---|---|
| 5,021,685 A * | 6/1991 | Kihara | ........... | H03K 19/018521 326/27 |
| 5,654,929 A * | 8/1997 | Mote, Jr. | ................ | G11C 11/408 365/149 |
| 6,445,444 B2 * | 9/2002 | Dunne | ......................... | 356/5.01 |
| 6,531,886 B1 * | 3/2003 | Eichfeld | .......... | H03K 19/00346 326/21 |
| 6,657,318 B2 * | 12/2003 | Ishikawa | ............. | H01L 23/5223 257/202 |
| 7,187,069 B2 * | 3/2007 | Uematsu | ............. | H01L 23/5223 257/685 |
| 8,217,704 B2 * | 7/2012 | Kohama | ............ | H03K 17/0828 327/108 |
| 8,476,572 B2 * | 7/2013 | Matsuda | ................. | H03F 3/087 250/214 A |
| 8,624,681 B2 * | 1/2014 | Guo | ..................... | H03K 3/0315 331/57 |
| 2010/0289562 A1 | 11/2010 | Kohama et al. | | |

FOREIGN PATENT DOCUMENTS

JP  05175427 A  7/1993
JP  2010288444 A  12/2010

\* cited by examiner

*Primary Examiner* — Jeffrey Zweizig

(74) *Attorney, Agent, or Firm* — Rossi, Kimms & McDowell LLP

(57) ABSTRACT

In some aspects of the invention, provided is a semiconductor device capable of compensating sufficiently instantaneous drop of power source voltage without enlarging device scale extremely. When digital circuit and power device driving circuit are formed on chip in the state connected to power source in common in parallel, for digital circuit of functional circuit remaining abnormal state after power source recovery and analog circuit and power device driving circuit of functional circuit retaining continuously normal state even before power source recovery, resistors are formed on chip in power source E side of the functional circuits, and in addition, capacitors are formed on chip 1 in parallel with the functional circuits, and consequently, it becomes possible to enlarge each resistance value of resistors as compared with a case of attaching externally resistors and capacitors in the entire chip.

6 Claims, 3 Drawing Sheets

SEMICONDUCTOR DEVICE INCLUDING FUNCTIONAL CIRCUITS

BACKGROUND OF THE INVENTION

1. Field of the Invention

Embodiments of the invention are related to semiconductor devices having integrated circuits on a chip.

2. Related Art

In Japanese Unexamined Patent Application Publication No. H5-175427 ("Document 1"), some resistors are inserted into each of power source lines of a plurality of circuit blocks in order to prevent surge voltage in excess of stationary state. In addition, in Japanese Unexamined Patent Application Publication No. 2010-288444 ("Patent Document 2") (see FIG. 6), a low-pass filter is constituted by a capacitor arranged in parallel with semiconductor integrated circuits and a resistor arranged in power source side thereof in order to compensate power source voltage for instantaneous drop of power source voltage in particular.

However, a configuration such as that shown in Patent Document 1 is not well suited for dealing with instantaneous drops of power source voltage. Additionally, when a plurality of functional circuits are connected to a common power source in parallel, to form a structure such as that shown in Patent Document 2, the sum of electric current through the plurality of functional circuits flows to a resistor forming a low-pass filter. Therefore, with such a configuration, voltage drop of this resistor needs to be taken into consideration. That is, in order that direct input voltage to functional circuits thereof as a power supply becomes voltage value or greater required to operate, by reducing resistance value of the resistor forming the low-pass filter, it is required that voltage drop thereby is forced to become predetermined voltage or less to be set. Then, filter function may not be sufficiently performed for compensating instantaneous drop of power source voltage because resistance value of the resistor is small. Further, when attaching externally capacitors arranged in parallel with semiconductor integrated circuit and resistors arranged in power source side thereof, space and cost for terminals and external components of semiconductor integrated circuit increase, and a device scale using the semiconductor integrated circuit consequently becomes larger. Thus, as described above, there exists certain problems in the related art.

SUMMARY OF THE INVENTION

Embodiments of the invention address these and other problems in the related art. Embodiments of the invention provide a semiconductor device that can sufficiently compensate instantaneous drop of power source voltage without enlarging extremely a device scale to be applied.

A semiconductor device related to embodiments of the invention can include forming integrated circuits on a chip, among a plurality of functional circuits connected to common power source in parallel, forming resistors in power source side of previously set functional circuits on the chip, and forming capacitors in parallel with the functional circuits on the chip, and then the previously set functional circuits are characterized by providing at least one of functional circuits that retain abnormal state even after power source recovery and functional circuits that should continuously retain normal state even before power source recovery, according to transient change in the power source.

In addition, in some embodiments, a digital circuit provides functional circuit that retains abnormal state even after the power source recovery. Further, in some embodiments power device driving circuit provides functional circuit that should continuously retain normal state even before the power source recovery. Also, in some embodiments, the capacitors have capacitance value to be able to maintain lower limit value of operating power voltage range of arranged functional circuit for a previously set predetermined time or longer. Moreover, in this semiconductor device, it is desirable that the resistors have resistance value to achieve operating current of arranged functional circuit or operating power source voltage of arranged functional circuit.

Thus, in accordance with embodiments of the invention, resistors are formed in power source side of functional circuit and capacitors are formed in parallel with the functional circuit. Since these resistors and capacitors are formed on a chip together with integrated circuit including functional circuits, a device scale does not become extremely large. Further, as compared with a case of forming a filter composed of resistor and capacitor for the entire semiconductor integrated circuit, it becomes possible to enlarge resistance value of resistors formed in power source side of functional circuits, and it is able to sufficiently compensate instantaneous drop of power source voltage. In addition, it becomes possible to constitute the optimum filter which secures lower limit value of power source voltage and power voltage compensation time in every functional circuit.

Further, by arranging resistors and capacitors in digital circuit, it is able to avoid retention of abnormal state after power source recovery for transient change in power source. Additionally, by arranging resistors and capacitors in power device driving circuit, it is able to retain continuation of normal state before power source recovery for transient change in power source. Further, by providing capacitance value to be able to maintain lower limit value of operating power voltage range of arranged functional circuit for a previously set predetermined time or longer, and by providing resistance value to achieve operating current of arranged functional circuit or operating power source voltage of arranged functional circuit, therefore, it is able to avoid retention of abnormal state after power source recovery for transient change in power source and to retain continuation of normal state before power source recovery for transient change in power source.

DESCRIPTION OF THE PREFERRED EMBODIMENTS

Figure 1:
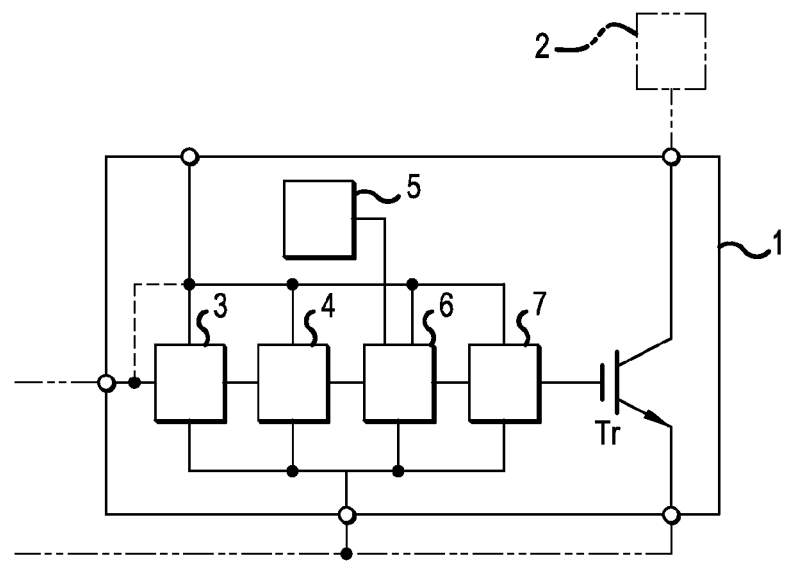
FIG. 1 is a block diagram showing an example of integrated circuits on a chip related to an embodiment of semiconductor device of the present invention.

FIG. 1 is a block diagram showing an example of integrated circuits on a chip related to an embodiment of semiconductor device of the present invention. A semiconductor device shown in this block diagram is constituted by integrated circuits formed on one chip 1. This semiconductor device is used for driving external actuator 2, and includes each functional circuit such as input part 3, delay part 4, detection part 5, operation part 6, and driving part 7, as functional circuits; and driving part 7 drives power transistor Tr of power device and consequently actuator 2 is driven. Among the functional circuits, input part 3, delay part 4, detection part 5 and driving part 7 process analog signal and perform transmission/reception of signal by using analog signal mainly, while operation part 6 processes digital signal and performs transmission/reception of signal by using digital signal mainly. In this case, power source for input part 3, delay part 4, detection part 5, operation part 6 and driving part 7 is available with two different types: one uses signal voltage to semiconductor device shown by broken line, the other uses external power source shown by solid line.

Figure 2:
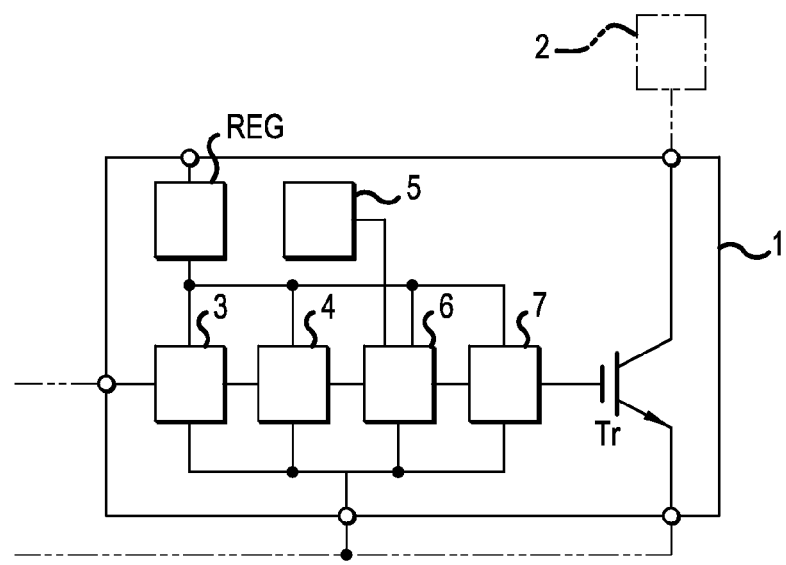
FIG. 2 is a block diagram showing another example of integrated circuits on a chip related to an embodiment of semiconductor device of the present invention.

FIG. 2 provides a structure to further add regulator REG on the same chip 1 as integrated circuit on a chip of semiconductor device in FIG. 1. A power source of semiconductor device including this integrated circuit is for example a battery (a storage battery) mounted on a vehicle. As is well known, in some circumstances, a battery is apt to supply unstable voltage as a power source. Regulator REG forms an internal power source of integrated circuit by stepping down this battery voltage. In this case, an output voltage of regulator REG corresponds to power source voltage E described below. In addition, this integrated circuit also includes input part 3, delay part 4, detection part 5 and driving part 7 for processing analog signal, and operation part 6 for processing digital signal, as each functional circuit.

Figure 3:
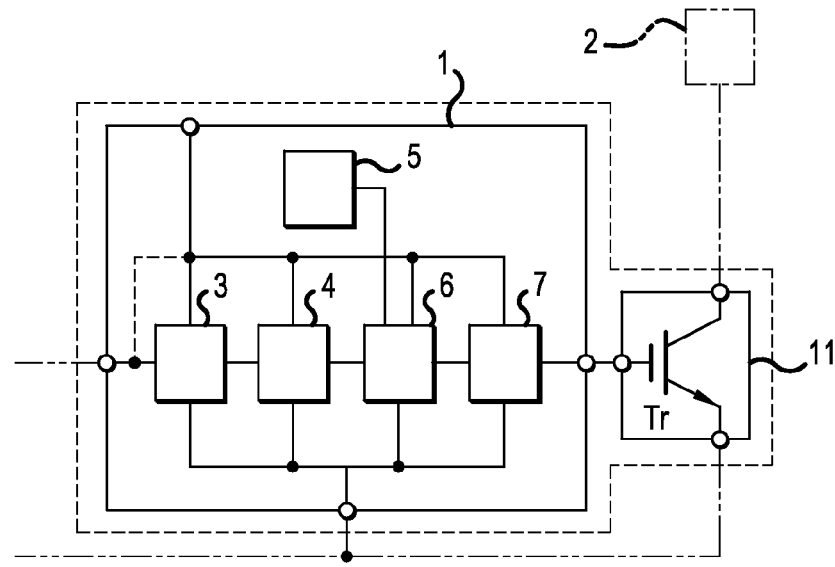
FIG. 3 is a block diagram showing still another example of integrated circuits on a chip related to an embodiment of semiconductor device of the present invention.

FIG. 3 provides a structure to form power transistor Tr on a separate chip 11 from integrated circuit on a chip of semiconductor device in FIG. 1. Generally, current flowing through actuator 2 is large compared to current flowing through each functional circuit such as input part 3, delay part 4, detection part 5, and operation part 6. Because large current flows through power transistor Tr for controlling heavy current of this actuator 2, the power transistor Tr easily generates heat. By forming this power transistor Tr of easy heat generation on the separate chip 11 from the chip 1 with functional circuits such as input part 3, delay part 4, detection part 5 and operation part 6, functional circuits on the chip 1 can be thermally separated from the power transistor Tr, and then some functions of each functional circuit can be secured.

Figure 4:
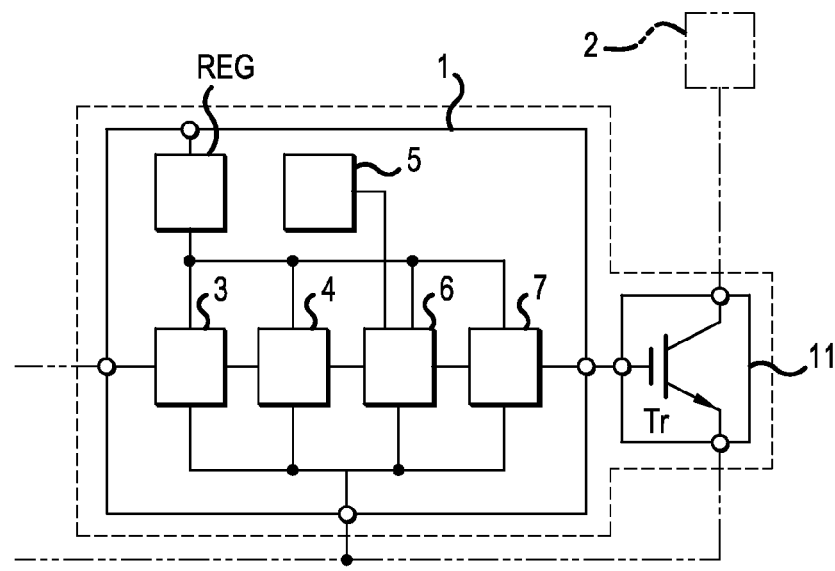
FIG. 4 is a block diagram showing further another example of integrated circuits on a chip related to an embodiment of semiconductor device of the present invention.

FIG. 4 provides a combination of integrated circuit in FIG. 2 and integrated circuit in FIG. 3, and provides a structure to add regulator REG to integrated circuit in FIG. 1 and to form power transistor Tr on separate chip 11. This semiconductor device can also have, for example, a battery mounted on a vehicle as power source, and power transistor Tr can drive, for example, ignition device of engine (igniter) as actuator 2. Accordingly, regulator REG makes internal power source of integrated circuit by stepping down battery voltage, and power transistor Tr to be apt to become high temperature because of driving igniter is thermally separated from functional circuits such as input part 3, delay part 4, detection part 5, and operation part 6.

Figure 5:
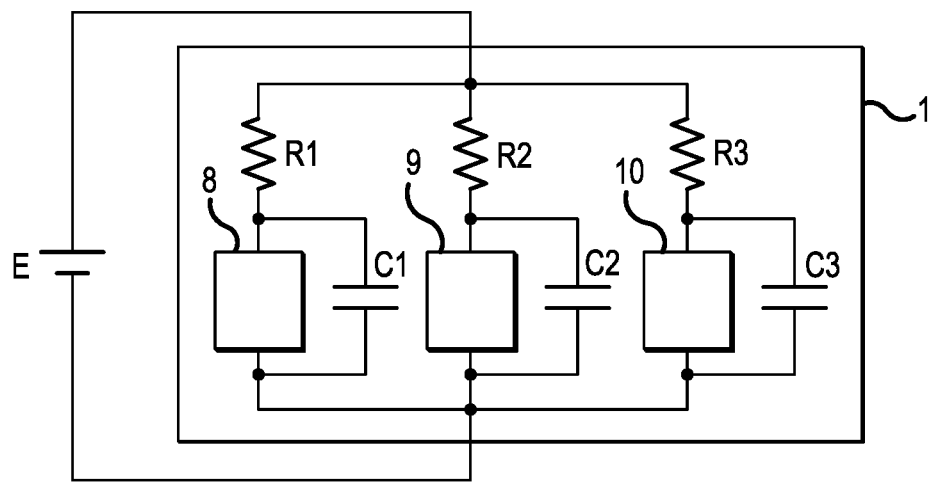
FIG. 5 is a block diagram classifying functional circuits in semiconductor device of FIGS. 1 to 4 from another viewpoint.

FIG. 5 is a block diagram on functional circuits in a semiconductor device of FIG. 1, which are classified by a different viewpoint: allowable range of voltage drop due to resistors constituting low-pass filters described below and voltage range that capacitors constituting the same filters should retain at the time of power voltage drop (shut off). Here functional circuits are shown such as digital circuit 8 to perform arithmetic processing mainly, analog circuit 9 like level shifter, and power device driving circuit 10 to drive power transistor. In these circuits, state storage and transmission/reception of signal are performed by digital signal in digital circuit 8, and transmission/reception of signal are performed by analog signal in analog circuit 9 and power device driving circuit 10. These digital circuit 8, analog circuit 9 and power device driving circuit 10 are connected to common power source E in parallel. In this situation, internally stored data is modified by instantaneous drop of power source voltage described below in digital circuit 8 and so-called bit error occurs, and then the abnormal state (bit error) is retained even after power source recovery. In addition, even though instantaneous drop of power source voltage occurs in power device driving circuit 10, it is desired to prevent that power transistor (power device) Tr driven by the power device driving circuit 10 may fall into abnormal state; therefore, it is necessary to continuously retain normal state even before power source recovery where power source voltage is lowering. This abnormal state of power transistor Tr means for example that sufficient gate voltage cannot be provided to power semiconductor driven by the power device driving circuit 10 and then the power semiconductor can apply only smaller current than required current. Further, to continuously retain power device driving circuit 10 with normal state, it is required to continuously retain normal state also to analog circuit 9 for providing signal to this power device driving circuit 10 directly or indirectly, before power source recovery where power source voltage is lowering.

Here, even if the same normal states are maintained, analog circuit 9 and power device driving circuit 10 require different minimum power source voltages. Generally, power device driving circuit 10 for driving external power semiconductor may not make output voltage thereof, for example the above-mentioned gate voltage, lowered frequently; therefore, power device driving circuit 10 is required to maintain higher voltage of power source compared to analog circuit 9. Further, digital circuit 8 could have power source voltage capable of retaining internal storage data, and tends to be able to maintain normal state even in relatively low power source voltage. That is, magnitude relation of the minimum power source voltage to secure an operation generally provides the following: power device driving circuit 10>analog circuit 9≥digital circuit 8 in order.

In addition, power source E for providing these functional circuits with power source is illustrated with external power source form in FIG. 5, but not limited, includes aspects of FIG. 1 and FIG. 3, or FIG. 2 and FIG. 4. That is, voltage to be supplied from power source E in FIG. 5 includes various aspects such as being supplied from external power source directly, stepping down external power source voltage by internal regulator, and being provided as signal voltage to semiconductor device.

And in this embodiment, resistors R1 to R3 are inserted between power source E side and each of power source terminals in digital circuit 8, analog circuit 9 and power device driving circuit 10 which are connected to common power source E in parallel. Further, capacitors C1 to C3 are arranged to digital circuit 8, analog circuit 9 and power device driving circuit 10 respectively in parallel. Because digital circuit 8, analog circuit 9 and power device driving circuit 10 are formed on a common chip 1 as mentioned above, these resistors R1 to R3 and capacitors C1 to C3 are also formed on the common chip 1 together with each functional circuit 8 to 10. In other words, low-pass filters consisting of resistors R1 to R3 and capacitors C1 to C3 are individually formed in each of digital circuit 8, analog circuit 9, and power device driving circuit 10.

The low-pass filters are used for compensating lower limit value of operating voltage range to each functional circuit 8 to 10, against instantaneous drop of power source voltage. Additionally, diffusion resistor and polysilicon resistor can be applied as resistors R1 to R3 which are formed on the chip 1. Further, MOS capacitor and the like can be applied as capacitors C1 to C3 which are formed on the chip 1.

The resistance value of resistors R1 to R3 in these low-pass filters is found to consider operating current in each functional circuit 8 to 10 and voltage drop in the resistors. That is, the resistors have resistance value capable of securing operating power source voltage of each functional circuit 8 to 10 for the deduction of voltage drop in the resistors R1 to R3. For example, when a certain functional circuit has operating current of 10 μA and keeps voltage drop portion of resistor within 1V, the resistor arranged in power source side of the functional circuit has resistance value of 100 kΩ. On the other hand, a capacitance value of capacitors C1 to C3 (in some embodiments) must have greater than capacitance value capable of maintaining lower limit value of operating supply voltage range in arranged functional circuits 8 to 10 for previously set predetermined time or longer even if electric power supply from power source E stops. For example, when digital circuit 8 adjusts maintaining time for power source voltage equal to or greater than 50% of setting power source voltage to be 5 μs or longer, capacitance value of capacitor C1 can be determined by this time and the above operating current. It follows that the product of resistance value of resistor R1 and capacitance value of capacitor C1 becomes time constant T of low-pass filter. Similarly, resistance values of resistors R2, R3 and capacitance values of capacitors C2, C3 in analog circuit 9 and power device driving circuit 10 can be determined. That is, according to maintaining time of power source voltage and lower limit value of power source voltage for digital circuit 8, analog circuit 9, and power device driving circuit 10 respectively, it is possible to form the optimum low-pass filters for compensating them in each functional circuit 8 to 10. This provides a semiconductor device with no waste and the potential higher performance.

Here, a calculation example below shows a comparison between this embodiment and a case that the sum of electric current through a plurality of functional circuits flows into a single resistor to form a low-pass filter in the structure like Patent Document 2. That is, when operating current of digital circuit 8 is 10 μA and a drop portion of power source voltage is set to 0.1 V, resistance value of resistor R1 gets 10 kΩ as mentioned above. By comparison, when operating current of analog circuit 9 is 100 μA, resistance value of resistor R2 gets 1 kΩ a drop portion of power source voltage is similarly set to 0.1V. In a similar way, when operating current of power device driving circuit 10 is 100 μA and a drop portion of power source is 0.1V, resistance value of resistor R3 becomes 1 kΩ.

Figure 6:
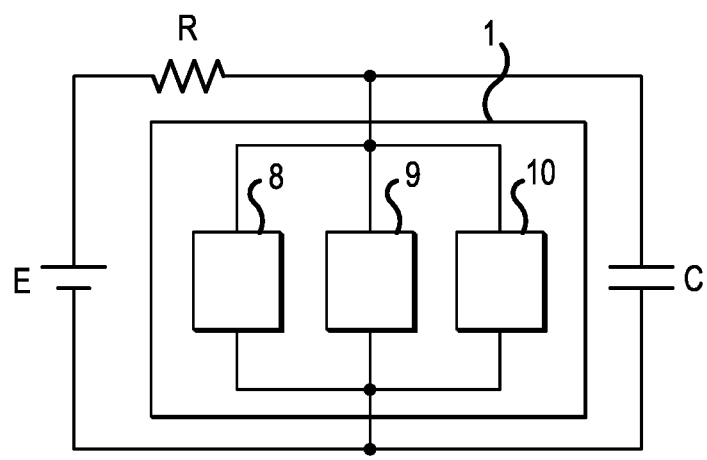
FIG. 6 is a block diagram showing a conventional functional circuit arrangement.

By contrast, when low-pass filter is constituted by attaching externally resistor R and capacitor C to a chip 1 where digital circuit 8, analog circuit 9 and power device driving circuit 10 are formed like conventional art shown in FIG. 6, resistance value r of resistor R is obtained by r=0.1 V/(10 μA+100 μA+100 μA)=476.2Ω and becomes fairly smaller than resistance value such as 1 kohm and 10 kohm mentioned above. Since a time constant of low-pass filter is the product value between resistance value of resistor and capacitance value of capacitor as stated above, it is limited to enlarge time constant of low-pass filter if resistance value of resistor is small, and consequently power voltage compensation by low-pass filter may not function well.

A semiconductor device of this embodiment can enlarge resistance value of resistors R1 to R3 formed in power source side of each functional circuit 8 to 10 and can make time constant of low-pass filter larger, and consequently compensation function of power source voltage is performed sufficiently. In addition, when each functional circuit 8 to 10 particularly has different lower limit value of power source voltage and different compensation time of power source voltage, it becomes possible that each function circuit 8 to 10 constitutes the optimum low-pass filter for securing lower limit value of power source voltage and compensation time of power source voltage, and it is also possible to improve performance as semiconductor device. Further, when each low-pass filter obtains equal time constant, it is able to reduce capacitance value of capacitors C1 to C3 if it is able to enlarge resistance value of resistors R1 to R3. When both capacitor and resistor are formed on a chip, chip size is apt to become larger. Generally, however, enlarging resistance value of resistor can suppress increase of chip size rather than enlarging capacitance value of capacitor; therefore, enlarging resistance value of resistor can reduce chip size rather than enlarging capacitance value of capacitor if it is able to enlarge resistance value of resistor like semiconductor device in this embodiment.

Thus semiconductor device of this embodiment forms resistors R1 to R3 in power supply E side of the functional circuits 8 to 10, and in addition, forms capacitors C1 to C3 in parallel with the functional circuits 8 to 10, for each of or at least one of functional circuit 8 to retain abnormal state even after power source recovery and functional circuit 9, 10 to continuously retain normal state certainly even before power source recovery. Since these resistors R1 to R3 and capacitors C1 to C3 are formed on the chip 1 together with integrated circuit including functional circuits 8 to 10, device scale does not extremely grow larger. Further, as compared with a case of forming a filter consisting of resistor R and capacitor C in the entire semiconductor integrated circuit where a plurality of functional circuits 8 to 10 are connected to common power source E in parallel, it becomes possible to enlarge resistance value of resistors R1 to R3 formed in power supply E side of functional circuits 8 to 10, and then it is able to sufficiently compensate instantaneous drop of power supply voltage. In addition, when each of functional circuits 8 to 10 has different lower limit value of power source voltage and different compensation time of power source voltage, each of functional circuits 8 to 10 can constitute respective optimum low-pass filters to secure lower limit value of power source voltage and compensation time of power source voltage.

Further, by arranging resistor R1 and capacitor C1 in digital circuit 8, it is able to avoid retaining abnormal state after power source recovery for transient change in power source E. Also, by arranging resistor R3 and capacitor C3 in power device driving circuit 10, it is able to retain continuing normal state before power source recovery for transient change in power source E. Additionally, by providing capacitance value capable of maintaining lower limit value of operating power voltage range in arranged functional circuits 8 to 10 for a previously set predetermined time or longer, it is able to avoid retaining abnormal state after power source recovery for transient change in power source E, and to retain continuing normal state before power source recovery.

In addition, by providing resistance value to achieve operating current of arranged functional circuits 8 to 10, or operating power source voltage of arranged functional circuits 8 to 10, it is able to avoid retaining abnormal state after power source recovery for transient change in power source E, and to retain continuing normal state before power source recovery. Further, when putting together functional circuits to be identical in lower limit value of allowable operating power voltage range, it is no need to provide an unnecessary margin for resistance value of resistor in filter.

In addition, it is substantially required to comprehensively evaluate increase in chip size and cost accompanied by forming resistors and capacitors on a chip, and increase in device size and cost by attaching externally resistors and capacitors to semiconductor integrated circuit, and to think about what constitution low-pass filter has and where low-pass filter is arranged in semiconductor device.

This application is based on, and claims priority to, Japanese Patent Application No. 2014-120222, filed on Jun. 11, 2014. The disclosure of the priority application, in its entirety, including the drawings, claims, and the specification thereof, is incorporated herein by reference.

What is claimed is:

1. A semiconductor device including an integrated circuit on a chip, the semiconductor device comprising:
   a plurality of functional circuits connected to a common power source in parallel, the plurality of functional circuits including at least a first functional circuit and a second functional circuit, the first functional circuit including internally stored data;
   a first resistor provided on the chip in a power source side of the first functional circuit;
   a second resistor provided on the chip in a power source side of the second functional circuit:
   a first capacitor provided on the chip in parallel with the first functional circuit; and
   a second capacitor provided on the chip in parallel with the second functional circuit;
   wherein the first functional circuit includes a first predetermined minimum operating voltage level;
   wherein the second functional circuit includes a second predetermined minimum operating voltage level, the second predetermined minimum operating voltage level being higher than the first predetermined minimum voltage level;
   wherein the first capacitor is configured to maintain the first predetermined minimum operating voltage level at the first functional circuit for a first predetermined time or longer, during a transient of the power source; and
   wherein the second capacitor is configured to maintain the second predetermined minimum operating voltage level at the second functional circuit for a second predetermined amount of time or longer, during a transient of the power source.

2. The semiconductor device according to claim 1, wherein the first functional circuit is a digital circuit.

3. The semiconductor device according to claim 1, wherein the second functional circuit is an analog circuit.

4. The semiconductor device according to claim 1, wherein the second functional circuit is a driving circuit.

5. The semiconductor device according to claim 1, wherein the first resistor comprises a resistance value to achieve a predetermined operating current of the first functional circuit.

6. The semiconductor device according to claim 1, wherein the second resistor comprises a resistance value to achieve a predetermined operating current of the second functional circuit.

* * * * *